United States Patent [19]

Kasashima et al.

[11] Patent Number: 5,694,069

[45] Date of Patent: Dec. 2, 1997

[54] VARIABLE RESISTOR AND GAIN CONTROL CIRCUIT AND INTEGRATED CIRCUIT HAVING THE VARIABLE RESISTOR

[75] Inventors: Masaaki Kasashima; Hiroshi Nakamura, both of Tokyo, Japan

[73] Assignee: Oki Electric Industry Co., Ltd., Tokyo, Japan

[21] Appl. No.: 507,149

[22] Filed: Jul. 26, 1995

[30] Foreign Application Priority Data

Aug. 8, 1994 [JP] Japan .................. 6-185748

[51] Int. Cl.$^6$ .................................................. H03G 3/30
[52] U.S. Cl. ................................ 327/179; 330/254
[58] Field of Search ............................ 327/179, 180,
 327/108, 205, 206, 305, 308, 309, 312,
 327, 328, 331, 333, 334, 355, 403, 404,
 431, 427, 435, 437; 330/278, 254

[56] References Cited

U.S. PATENT DOCUMENTS

| | | | |
|---|---|---|---|
| 3,810,035 | 5/1974 | Gundry | 327/308 |
| 4,727,597 | 2/1988 | Dautriche | 455/333 |
| 4,803,384 | 2/1989 | Yamane et al. | 327/179 |
| 4,975,604 | 12/1990 | Barta | 327/308 |
| 5,039,879 | 8/1991 | Parrish | 327/306 |
| 5,055,711 | 10/1991 | Dobkin | 327/327 |
| 5,180,988 | 1/1993 | McDaniel | 327/306 |
| 5,281,928 | 1/1994 | Ravid et al. | 327/328 |
| 5,309,048 | 5/1994 | Khabbaz | 327/306 |
| 5,323,123 | 6/1994 | Philippe | 330/277 |
| 5,386,109 | 1/1995 | Ikeuchi et al. | 250/214 R |

OTHER PUBLICATIONS

Alan B. Grebene, "Bipolar and MOS Analog Integrated Circuit Design", John Wiley & Son, 1984, pp. 443–449.

*Primary Examiner*—Timothy P. Callahan
*Assistant Examiner*—My-Trang Nu Ton
*Attorney, Agent, or Firm*—Rabin, Champagne & Lynt, P.C.

[57] ABSTRACT

A gain control circuit according to the present invention comprises an amplifier circuit for controlling gain thereof to amplify an input signal and a control circuit. The amplifier circuit includes an input terminal for inputting the signal, a first transistor having a drain electrode connected to a first potential through a first resistive means and a source electrode connected to a second potential, and an output terminal connected to a first electrode and varies the value of a resistance between the source and drain of the first transistor based on the signal supplied to the input terminal. The control circuit is composed of a second transistor having a source electrode connected to the source of the first transistor, a drain electrode connected to the drain of the first transistor and a gate electrode supplied with a control signal and varies the value of a resistance therebetween based on the control signal supplied to the gate electrode. Thus, since the gain control circuit is simple in structure, it can be activated at a low voltage and can realize a wide gain control range. It is also possible to achieve a gain control circuit whose output does not have distortion.

13 Claims, 9 Drawing Sheets

VARIABLE RESISTOR AND GAIN CONTROL CIRCUIT AND INTEGRATED CIRCUIT HAVING THE VARIABLE RESISTOR

BACKGROUND OF THE INVENTION

1. Field of the Invention

This invention relates to a gain control circuit used in a high-frequency operating gain variable amplifier.

2. Description of the Related Art

In general, a differential type or Gilbert cell type amplifier has been used as a gain control circuit.

This technology has been described in a technical paper entitled "BIPOLAR AND MOS ANALOG INTEGRATED CIRCUIT DESIGN" (1984) by Alan B. Grebene, John Wiley & Son, Inc. (U.S.A.), p 443–449.

SUMMARY OF THE INVENTION

It is an object of the present invention to provide a gain control circuit capable of operating at a voltage lower than that employed in a conventional gain control circuit, realizing a wide gain control range and preventing distortion from occurring at an output thereof.

According to one aspect of the present invention, for achieving the above object, there is provided a gain control circuit comprising an amplifier circuit which includes an input terminal for receiving an input signal therein, a first electrode connected to a first potential through a first resistive means, a second electrode connected to a second potential and an output terminal connected to the first electrode and varies a conducting state between the first and second electrodes based on the signal supplied to the input terminal, and a control circuit which includes a control electrode supplied with a control signal and varies a conducting state between the first and second electrodes based on the control signal supplied to the control electrode.

BRIEF DESCRIPTION OF THE DRAWINGS

While the specification concludes with claims particularly pointing out and distinctly claiming the subject matter which is regarded as the invention, it is believed that the objects, features and advantages of the invention will be better understood from the following description, together with the accompanying drawings in which:

DETAILED DESCRIPTION OF THE PREFERRED EMBODIMENTS

Preferred embodiments of the present invention will hereinafter be described in detail with reference to the accompanying drawings.

First Embodiment

Figure 1:
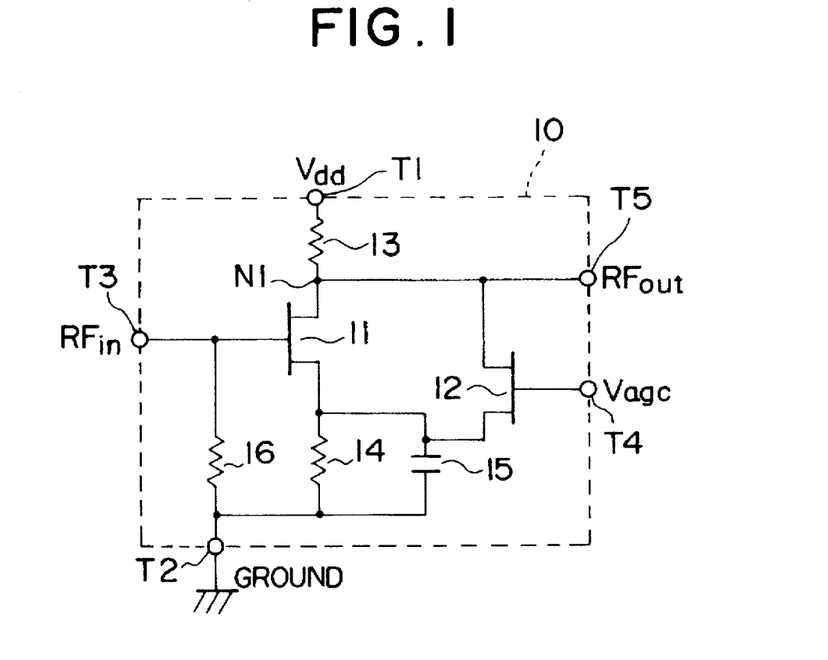
FIG. 1 is a circuit, diagram of a gain control circuit showing a first embodiment of the present invention.

FIG. 1 is a circuit, diagram of a gain control circuit showing a first embodiment of the present invention.

A gain control circuit 10 provided on a single chip indicated by the broken line in FIG. 1 comprises a power terminal T1, a ground terminal T2, an input terminal T3, a control terminal T4, an output terminal T5 and two depletion type GaAs MESFETs (GaAs Metal Semiconductor Field Effect Transistors, which are called simply "MESFETs") 11 and 12 corresponding to first and second transistors. The MESFET 11 amplifies a high-frequency signal provided to the gate thereof from the input terminal T3. The MESFET 12 is used as a variable resistor for gain control. The drain of the MESFET 11, which serves as a first electrode, is electrically connected to the power terminal T1 through a load resistor 13 and the source thereof, which serves as a second electrode, is electrically connected to the ground terminal T2 through a resistor 14 used as a second resistor and an a.c. bypass capacitor 15, parallel-connected to each other. The resistor 14 serves so as to self-bias each of the MESFETs 11 and 12. The capacitor 15 has the function of connecting the sources of the MESFETs 11 and 12 to the ground on a high-frequency basis. A high resistor 16 serving as a first resistor, for connecting the gate of the MESFET 11, which serves as a control electrode, to the ground, is provided between the ground terminal T2 and the gate of the MESFET 11. The drain of the MESFET 12 is electrically connected to a node N1 for coupling the drain of the MESFET 11 and the resistor 13 to each other. The connecting node N1 is electrically connected to the output terminal T5. The gate of the MESFET 12 is electrically connected to the control terminal T4 and the source of the MESFET 12 is electrically connected to the source of the MESFET 11 as well as connected to the resistor 14 and the capacitor 15.

The operation of the gain control circuit shown in FIG. 1 will now be described below.

Consider that the power terminal T1 is electrically connected to a source potential $V_{dd}$, the ground terminal T2 is electrically connected to a Ground and a control voltage $V_{agc}$ is provided at the control terminal T4 as a control signal. A high-frequency signal $RF_{in}$ supplied at the input terminal T3 is amplified by the MESFET 11 and the amplified high-frequency signal $RF_{out}$ is provided at the output terminal T5. Upon its amplification, a turned on resistance $R_{on}$ of the MESFET 12 and a resistance value $R_{13}$ of the resistor 13 serve as a load R to the MESFET 11. The magnitude of the load R is given by the following equation (i). The voltage gain of the gain control circuit can be represented as the product of the mutual conductance of the MESFET 11 and the load R.

$$R = R_{13} \times R_{on}/R_{13} + R_{on} \qquad (i)$$

When the resistance $R_{on}$ is reduced, the gain of the gain control circuit is lowered. When the resistance $R_{on}$ is sufficiently high as compared with the resistance value $R_{13}$ of the resistor 13, the gain of the gain control circuit can be represented as the product of the mutual conductance of the MESFET 11 and the resistance value $R_{13}$. When the level of the control voltage $V_{agc}$ is controlled so that a gate-to-source voltage of the MESFET 12 is positively biased as compared with a pinch-off voltage of the MESFET 12, the resistance $R_{on}$ is reduced so as to decrease the voltage gain of the gain control circuit. When the resistance $R_{on}$ is reduced, a current flows from the power terminal T1 to ground through the resistor 13, the MESFET 12 and the resistor 14. As the resistance $R_{on}$ decreases, the current increases to raise potentials applied across the resistors 13 and 14. Since the source potential $V_{dd}$ is kept constant, the difference in potential between the drain and source of the MESFET 11 is reduced and the mutual conductance of the MESFET 11 is decreased. Therefore, the voltage gain of the gain control circuit is reduced.

Further, when the current that flows into the resistor 14 increases, a potential applied to the source of the MESFET 11 is raised so that a bias voltage applied to the gate of the MESFET 11 is shifted in the direction of pinching off the MESFET 11, or in a minus direction. Therefore, the mutual conductance of the MESFET 11 is reduced and the gain of the gain control circuit is further decreased.

Incidentally, when the level of the control voltage $V_{agc}$ is controlled to pinch off the MESFET 12, the gain control circuit provides the maximum gain. If the level of the control voltage $V_{agc}$ is gradually reduced, then the gain of the gain control circuit gradually decreases and hence the gain control circuit serves as an attenuator.

As described above, the gain control circuit according to the present embodiment can bring about the following advantages (1) through (4).

(1) The turned on resistance $R_{on}$ of the MESFET 12 is controlled by adjusting the level of the control voltage $V_{agc}$ provided at the gate of the MESFET 12. By controlling the resistance $R_{on}$ of the MESFET 12 alone, three adjustments can be simultaneously performed: an adjustment of the load R of the MESFET 11, an adjustment of the drain-to-source voltage of the MESFET 11, and an adjustment of the bias applied to the gate of the MESFET 11. Therefore, a simple gain control circuit is provided that is able to greatly vary the gain, is provided although it is of a simple circuit.

(2) Since the gain control circuit is simple in structure, a higher frequency signal can be amplified.

(3) Since a single-ended type simple circuit configuration free of cascading or the like is adopted, the gain control circuit can be activated at a low voltage.

(4) The capacitor 15 doubles as a high-frequency ground with respect to each of the MESFETs 11 and 12. Therefore, when an IC or the like, for example, is brought into high integration, the number of capacitors that are likely to occupy areas, may be one alone, thereby making it possible to lower the cost of a chip.

Second Embodiment

Figure 2:
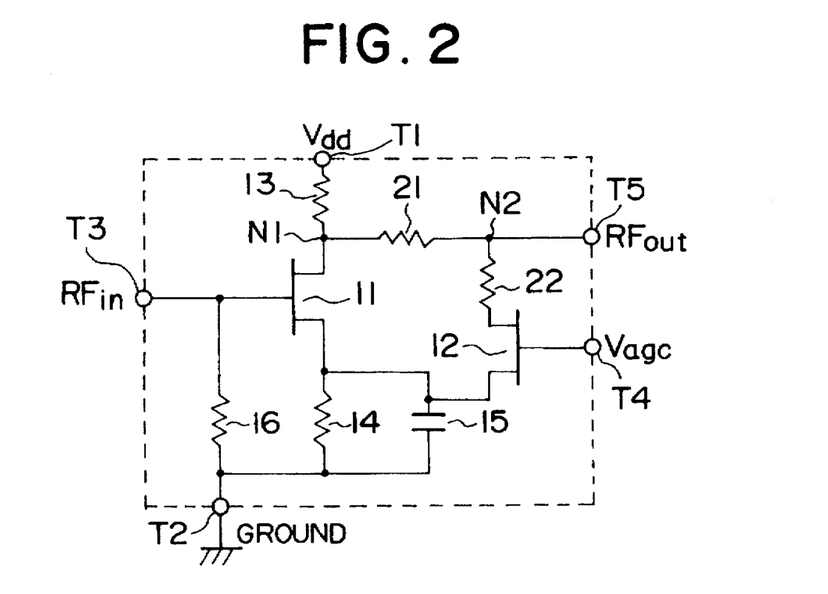
FIG. 2 is a circuit, diagram of a gain control circuit illustrating a second embodiment of the present invention.

FIG. 2 is a circuit, diagram of a gain control circuit showing a second embodiment of the present invention. Elements common to those shown in FIG. 1 are identified by common reference numerals.

The gain control circuit has two resistors 21 and 22, which respectively serve as third and fourth resistors, series-connected between the drains of the MESFETs 11 and 12 employed in the gain control circuit showing of the first embodiment shown in FIG. 1. The resistor 21 is electrically connected to the drain of the MESFET 11 and the resistor 22 is electrically connected to the drain of the MESFET 12. An output terminal T5 is electrically connected to a node N2 coupling the resistors 21 and 22 to each other. The operation of the gain control circuit shown in FIG. 2 will now be described.

The gain control circuit is identical in basic operation to that of the first embodiment. When an a turned resistance $R_{on}$ of the MESFET 12 is zero or is sufficiently low as compared with resistance values $R_{13}$ and $R_{14}$ of resistors 13 and 14, a drain-to-source voltage $V_{ds}$ magnitude of the MESFET 11 is given by the following expression (ii) if resistance values of the resistors 21 and 22 are respectively regarded as $R_{21}$ and $R_{22}$.

$$V_{ds} = V_{dd} \times (R_{21}+R_{22})/(R_{13}+R_{14}+R_{21}+R_{22}) \qquad (ii)$$

Namely, even when the resistance $R_{on}$ becomes near zero by controlling the level of a control voltage $V_{agc}$, the two resistors 21 and 22 prevent the drain-to-source voltage $V_{ds}$ of the MESFET 11 from being excessively lowered. Even when the resistance $R_{on}$ of the MESFET 12 becomes near zero due to the setting of the resistance values $R_{21}$ and $R_{22}$ of the resistors 21 and 22 to desired values, the pinching-off of the MESFET 11 due to excessive current supplied to the resistor 14 can be avoided by imposing restrictions on the current.

As described above, the gain control circuit of the present embodiment can further bring about the following advantages (5) through (7) in addition to the advantages (1) through (4) provided by the first embodiment.

(5) due to the provision of the resistors 21 and 22 between the drains of the MESFETs 11 and 12, the drain-to-source voltage $V_{ds}$ of the MESFET 11 can be prevented from being made lower than required. It is therefore possible to perform stable gain control.

(6) due to the provision of the resistors 21 and 22 between the drains of the MESFETs 11 and 12, a limitation can be imposed on the current that flows into the self-bias resistor 14 of the MESFET 11, thereby making it possible to perform stable gain control.

(7) Since the resistors 21 and 22 are provided between the drains of the MESFETs 11 and 12 and an output high-frequency signal $RF_{out}$ is provided at the node N2 between the resistors 21 and 22, the maximum amount of attenuation can be made greater.

Third Embodiment

Figure 3:
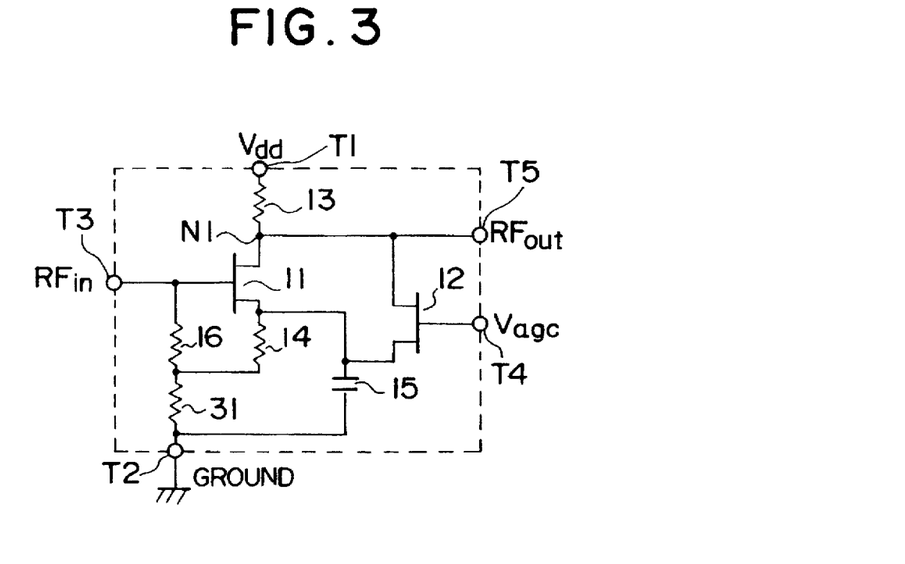
FIG. 3 is a circuit, diagram of a gain control circuit depicting a third embodiment of the present invention.

FIG. 3 is a circuit, diagram of a gain control circuit illustrating a third embodiment of the present invention. Elements common to those shown in FIG. 1 or 2 are identified by common reference numerals.

In the gain control circuit according to the present embodiment, an additional pinch-off potential setting resistor 31 is provided between the resistors 14 and 16 and the terminal T2 of the first embodiment shown in FIG. 1. That is, the two resistors 14 and 16 are electrically connected to a potential ground Ground through the resistor 31.

The operation of the gain control circuit shown in FIG. 3 will now be described.

Similarly to the first embodiment, the sources of two MESFETs 11 and 12 are connected to the Ground through a capacitor 15 on a high-frequency basis. A bias corresponding to a voltage applied across the resistor 14 is set between the gate and source of the MESFET 11. However, the source of the MESFET 12 is biased based on a voltage developed across the series-connected resistors 14 and 31. If the resistance value of the resistor 31 is set in such a manner that the voltage developed across the series-connected resistors 14 and 31 becomes greater than a pinch-off voltage of the MESFET 12 when a resistance $R_{on}$ of the MESFET 12 is sufficiently large and no current flows into the resistors 14 and 31 through the MESFET 12, then the MESFET 12 is pinched off when the level of a control voltage $V_{agc}$ is brought to 0 V. As a result, the gain control circuit shown in FIG. 3 can bring about the maximum gain.

In the present embodiment as described above, since the resistor 31 is provided between the two resistors 14 and 16 and the terminal T2, the gain can be greatly varied by adjusting only the level of the control voltage $V_{agc}$, which is identical in sign to a source voltage $V_{dd}$ while the depletion-type MESFETs are being used.

Fourth Embodiment

Figure 4:
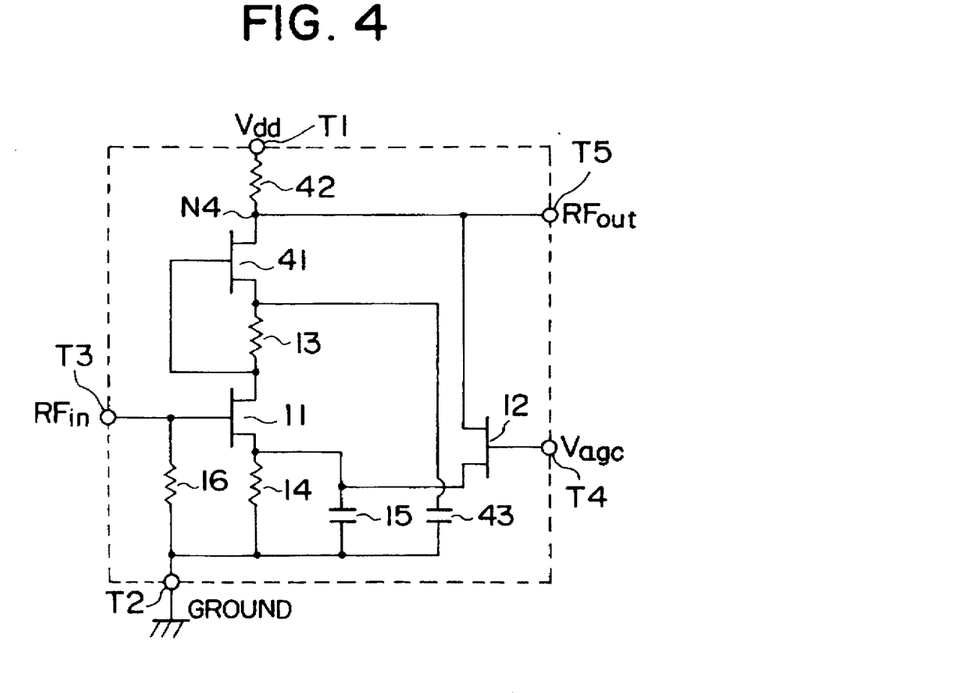
FIG. 4 is a circuit, diagram of a gain control circuit showing a fourth embodiment of the present invention.

FIG. 4 is a circuit diagram of a gain control circuit showing a fourth embodiment of the present invention. Elements common to those shown in FIG. 1 are identified by common reference numerals.

A one-stage amplifier circuit is configured in the first embodiment, whereas a two-stage amplifier circuit is configured in the present embodiment.

Described specifically, the gain control circuit shown in FIG. 4 has a MESFET 41 serving as a third transistor and a load resistance or resistor 42 serving as a second load resistor, both provided between the resistor 13 and the power terminal T1 which were employed in the first embodiment. The source of the MESFET 41 is electrically series-connected to the resistor 13 and is electrically connected to a potential ground Ground through a second a.c. bypass capacitor 43 at a ground terminal T2. The drain of the MESFET 41 is electrically connected to a source potential $V_{dd}$ through the load resistor 42 at the power terminal T1. Further, the gate of the MESFET 41 is electrically connected to the drain of a MESFET 11. Incidentally, the drain of the MESFET 12 is electrically connected to a node N4 coupling the drain of the MESFET 41 and the load resistor 42 to each other. The node N4 is electrically connected to an output terminal T5.

The operation of the gain control circuit shown in FIG. 4 will now be described.

When the MESFET 12 is in a pinched-off state, the present gain control circuit can provide the maximum gain. The turned on resistance $R_{on}$ of the MESFET 12 is reduced by adjusting or controlling the level of a control voltage $V_{agc}$. Therefore, drain-to-source voltages of the MESFETs 11 and 41 are respectively reduced and the potential applied to the source of the MESFET 11 is raised simultaneously when mutual conductances of the MESFETs 11 and 41 decrease. The mutual conductance of the MESFET 11 is further reduced with an increase in the potential applied to the source of the MESFET 11. Since the resistance $R_{on}$ of the MESFET 12 constitutes a load of the MESFET 41 in conjunction with the parallel-connected load resistance 42, the gain of the second-stage amplifier circuit is also reduced if the on resistance $R_{on}$ decreases.

According to the present embodiment, as described above, a gain control range can be made wider due to the provision of the MESFET 41.

Fifth Embodiment

Figure 5:
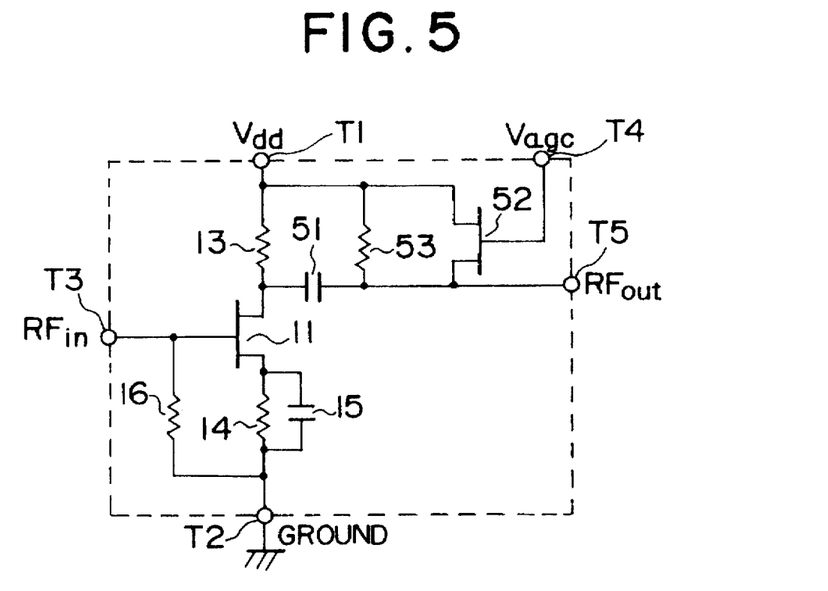
FIG. 5 is a circuit, diagram of a gain control circuit illustrating a fifth embodiment of the present invention.

FIG. 5 is a circuit diagram of a gain control circuit, showing a fifth embodiment of the present invention. Elements common to those shown in FIG. 1 are identified by common reference numerals.

Similarly to the first embodiment, the gain control circuit shown in FIG. 5 has an MESFET 11 for amplifying a high-frequency signal and is provided with a load resistor 13, a self-biasing resistor 14, a capacitor 15 for connecting the source of the MESFET 11 to ground on a high-frequency basis and a high resistor 16, similar to the circuit shown in FIG. 1. One of electrodes of an a.c. coupling capacitor 51 is electrically connected to a node N1 connecting the load resistor 13 and the drain of the MESFET 11 to each other, whereas the other electrode of the a.c. coupling capacitor 51 is electrically connected to a output terminal T5. The source of an MESFET 52 serving as a third transistor is electrically connected to the output terminal T5. Further, the drain of the MESFET 52 is electrically connected to a power terminal T1. The gate of the MESFET 52 is electrically connected to a control terminal T4 and is configured so as to receive a control voltage $V_{agc}$ at the terminal. Further, a high resistor 53 which serves as a second resistor, for fixing a potential applied to the source of the MESFET 52 to a source potential $V_{dd}$, is provided in parallel with the MESFET 52.

The operation of the gain control circuit shown in FIG. 5 will now be described.

A high-frequency signal $RF_{in}$ received at an input terminal T3 is amplified by the MESFET 11 and the amplified high-frequency signal $RF_{out}$ is generated at the output terminal T5 through the capacitor 51. At this time, a turned on resistance $R_{on}{}^*$ of the MESFET 52 and a resistance value $R_{13}$ of the load resistor 13 serve as a load $R^*$ with respect to the MESFET 11. The magnitude of the load $R^*$ is given by the following equation (iii):

$$R^* = R_{13} \times R_{on}{}^* / R_{13} + R_{on}{}^* \qquad \text{(iii)}$$

At this time, the voltage gain of the gain control circuit can be represented as the product of mutual conductance of the MESFET 11 and the load $R^*$. However, a resistance value $R_{53}$ of the resistor 53 is regarded as being sufficiently large as compared with the resistance value $R_{13}$ of the resistor 13 and the impedance of the capacitor 52 is regarded as being sufficiently low as compared with the resistance value $R_{13}$. When the level of the control voltage $V_{agc}$ is adjusted and a gate-to-source voltage of the MESFET 52 is negative-biased as compared with a pinch-off voltage of the MESFET 52, the resistance $R_{on}{}^*$ reaches a maximum and hence becomes sufficiently large as compared with the resistance value $R_{13}$. Therefore, the load $R^*$ can be regarded as the resistance value $R_{13}$ alone. At this time, the gain control circuit can provide the maximum gain.

When the level of the control voltage $V_{agc}$ is controlled to positively bias the gate-to-source voltage of the MESFET 52 as compared with the pinch-off voltage of the MESFET 52, the resistance $R_{on}{}^*$ is reduced to decrease the voltage gain of the gain control circuit. When the resistance $R_{on}{}^*$ is sufficiently reduced, the gain control circuit shown in FIG. 5 serves as an attenuator. Thus, since the load of the MESFET 11 continuously varies with a change in the level of the control voltage $V_{agc}$, the gain with respect to the amplification of the input signal $RF_{in}$ can be controlled to affect the output voltage.

As described above, the present embodiment can bring about the following advantages (8) through (12).

(8) The MESFET 11 used for amplification and the MESFET 52 for gain control are electrically connected to each other through the capacitor 51. Thus, since the dc bias of the MESFET 11 remains unchanged even if the gain is controlled, no degradation in distortion characteristics occurs even if the gain is changed.

(9) Since the resistor 53 and the drain of the MESFET 52 are electrically connected to the source, the gain of the gain control circuit can be controlled based on only a positive control potential identical to the source potential $V_{dd}$, using the depletion-type FETs.

(10) Since the gain control circuit is simple in circuit configuration, the present embodiment is excellent for application of a high-frequency signal in a manner similar to the first embodiment.

(11) Since the resistor 53 holds the difference in potential between the drain and source of the MESFET 52 at zero, power to be used up by a gain control unit is brought to zero so that the gain control circuit can be activated with low power consumption.

(12) Because the gain control circuit is of a single-end type simple circuit configuration, it can be activated at a low voltage in a manner similar to the first embodiment.

Sixth Embodiment

Figure 6:
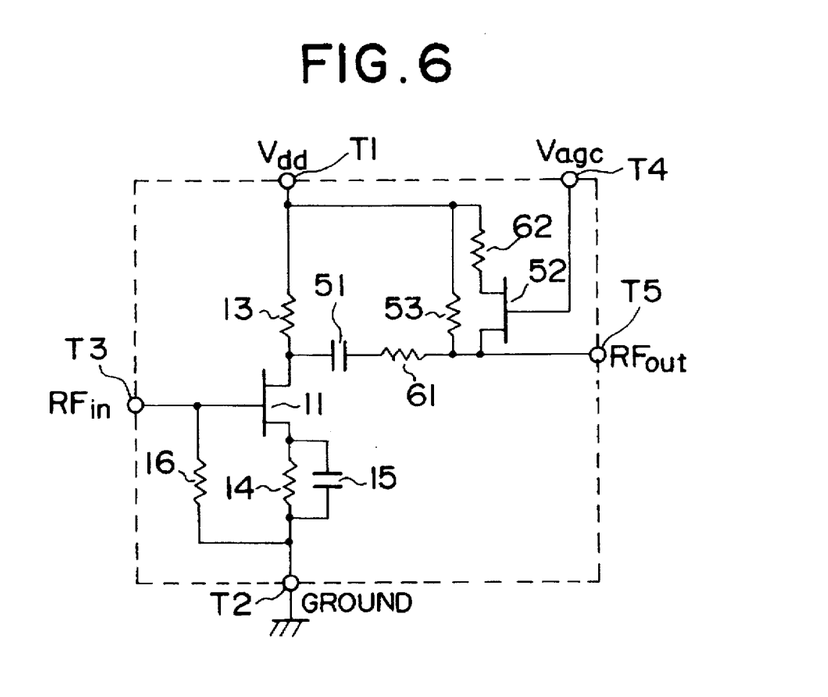
FIG. 6 is a circuit, diagram of a gain control circuit depicting a sixth embodiment of the present invention.

FIG. 6 is a circuit diagram of a gain control circuit, showing a sixth embodiment of the present invention. Elements common to those shown in FIG. 5 are identified by common reference numerals.

The present embodiment shows a modification of the gain control circuit illustrative of the fifth embodiment. In the present gain control circuit, a resistor 61 which serves as a third resistor, is provided between the capacitor 51 and the source of the MESFET 52 shown in FIG. 5. Further, a resistor 62 which serves as a fourth resistor, is provided between the drain of the MESFET 52 and a source potential $V_{dd}$. A node for connecting the source of the MESFET 52 and the resistor 62 to each other is electrically connected to an output terminal T5.

The operation of the gain control circuit shown in FIG. 6 will now be described.

An input signal $RF_{in}$ is amplified under the same operation as that performed in the fifth embodiment. However, when the sum of resistance values $R_{61}$ and $R_{62}$ of the resistors 61 and 62 is substantially identical to a resistance value $R_{13}$ of a resistor 13 or greater than the resistance value $R_{13}$ and the sum is sufficiently low as compared with a turned on resistance $R_{on}*$ of the MESFET 52 at the time of its pinch off, the signal first amplified by the MESFET 11 is voltage-divided with the resistance value $R_{61}$ and a resistance value $(R_{62}+R_{on}*)$. When the MESFET 52 is pinched off, the resistance $R_{on}*$ reaches a maximum so that the signal amplified by the MESFET 11 is generated at the output terminal T5 without attenuation. When a gate-to-source voltage of the MESFET 52 is positively biased as compared with a pinch-off voltage thereof, the signal amplified by the MESFET 11 is attenuated by being voltage-divided with the resistance value $R_{61}$ and the resistance value $(R_{62}+R_{on*})$ and the attenuated signal is generated at the output terminal T5.

Thus, the signal first amplified by the MESFET 11 is generated so as to pass through a circuit in which a voltage division ratio is continuously varied according to the level of a control voltage $V_{agc}$ inputted from a terminal T4 to control the gain of the gain control circuit. It is therefore possible to obtain a desired gain.

As described above, the present embodiment can further bring about the following advantages in addition to the advantages (8) through (12) provided by the fifth embodiment.

When the resistance value $R_{61}$ is set to a sufficiently large value as compared with the resistance $R_{on}*$ and the resistance value $R_{62}$ is set to a low value, the amount of attenuation can be increased as compared with the fifth embodiment. Further, the gain control circuit can set the maximum amount of attenuation without being affected by variations in the MESFET 52 by arbitrarily setting the resistance values $R_{61}$ and $R_{62}$.

Seventh Embodiment

Figure 7:
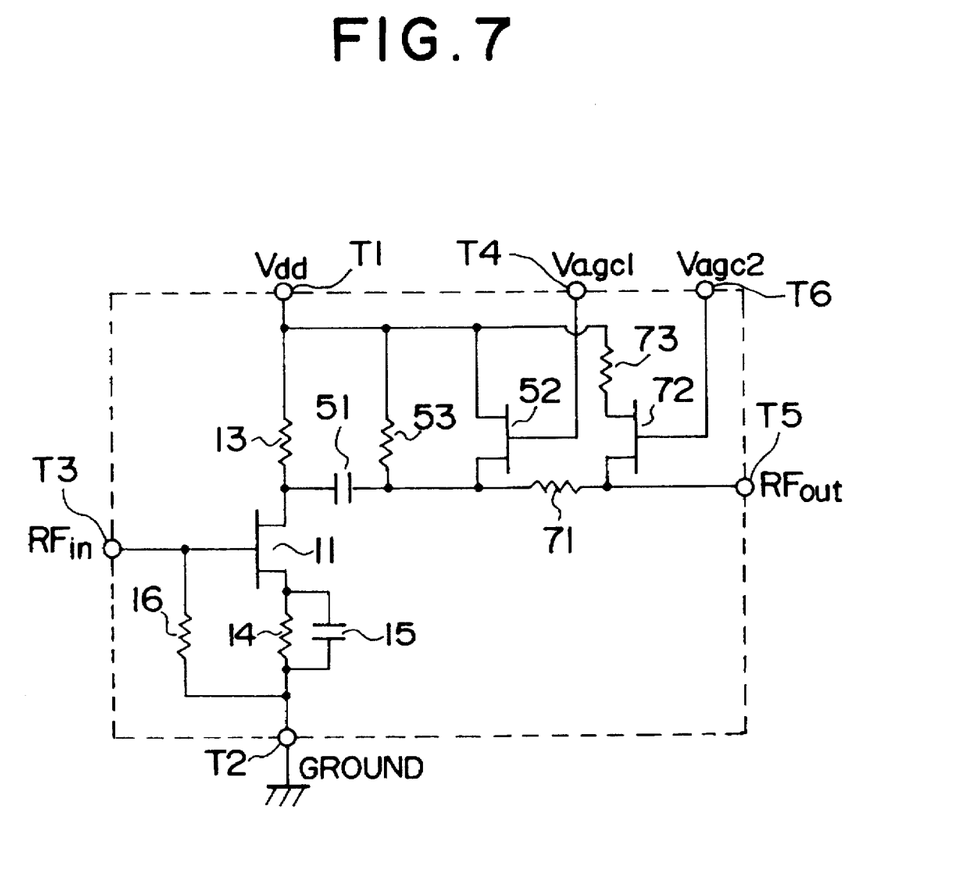
FIG. 7 is a circuit, diagram of a gain control circuit illustrating a seventh embodiment of the present invention.

FIG. 7 is a circuit diagram of a gain control circuit, showing a seventh embodiment of the present invention. Elements common to those shown in FIGS. 1 through 6 are identified by common reference numerals.

The present embodiment has a circuit configuration in which the voltage divider circuit employed in the sixth embodiment is further provided so as to correspond to the MESFET 52 employed in the fifth embodiment. The gain control circuit shown in FIG. 7 is provided with a resistor 71 serving as a third resistor, which is electrically connected to the source of the MESFET 52 shown in FIG. 5. The source of a MESFET 72, which serves as a third transistor, is electrically series-connected to the resistor 71. The drain of the MESFET 72 is electrically connected to a power terminal T1 through a resistor 73. A control voltage $V_{agc2}$ is applied to the gate of the MESFET 72 as a second control signal from a control terminal T6.

The operation of the gain control circuit shown in FIG. 7 will now be described.

Similarly to the fifth embodiment, a MESFET 11 amplifies an input signal $RF_{in}$ and the MESFET 52 attenuates the amplified signal, based on a control signal $V_{agc1}$. The attenuated signal is voltage-divided with a turned on resistance $R_{on}$ of the MESFET 72 and resistance values $R_{71}$ and $R_{73}$ of the resistors 71 and 73 and the thus processed signal is outputted. Namely, the resistance $R_{on}$ of the MESFET 72 is set based on the control voltage $V_{agc2}$. Further, the attenuated signal is voltage-divided with the resistance value $R_{71}$ and a resistance value $(R_{73}+R_{on}**)$ and the result of the voltage-division is generated at the output terminal T5.

Since the resistors 71,73 and the MESFET 72 are provided in the fifth embodiment as described above, the present embodiment can provide the following effects. When a circuit having an input impedance that is low, is electrically connected to a stage subsequent to the gain control circuit showing the sixth embodiment, for example, a signal is normally attenuated if the resistance value of the resistor 61 is excessively set, thereby making it difficult to obtain the satisfactory maximum gain. In the present embodiment, the signal is attenuated by the two stages of the MESFETs 52 and 72 and it is hence unnecessary to increase the resistance value R71 of the resistor 71. It is therefore possible to obtain a sufficient amount of attenuation.

Eighth Embodiment

Figure 8:
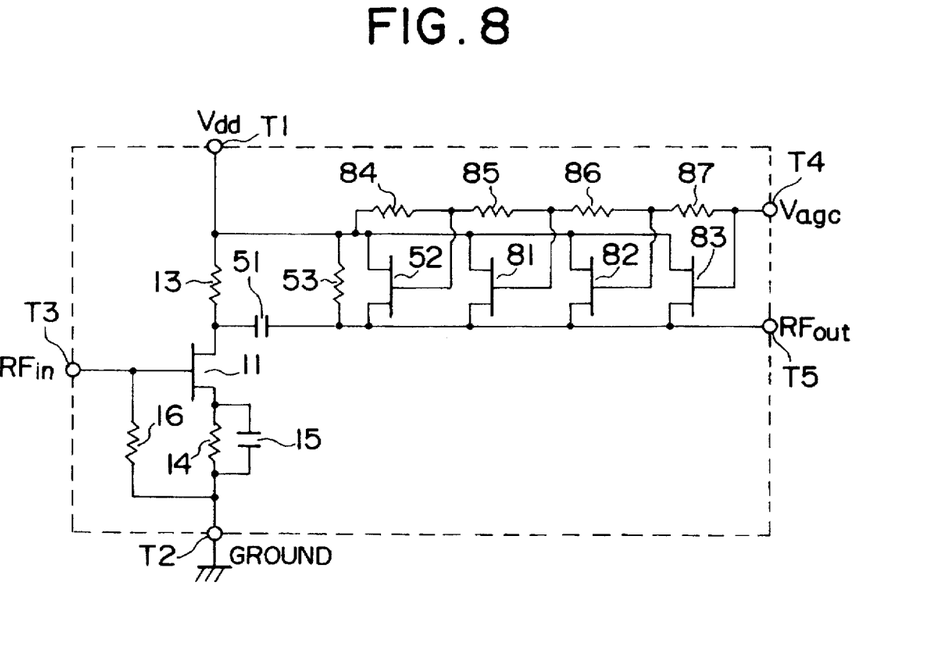
FIG. 8 is a circuit, diagram of a gain control circuit showing an eighth embodiment of the present invention.

FIG. 8 is a circuit diagram of a gain control circuit, showing an eighth embodiment of the present invention. Elements common to those shown in FIGS. 1 through 7 are identified by common reference numerals.

The present embodiment shows a modification of the fifth embodiment shown in FIG. 5. Three MESFETs 81 through 83, which serve as third transistors, are provided in the present embodiment. The MESFETs 81 through 83 are provided in parallel with a MESFET 52. The drains of the MESFETs 81 through 83 and the MESFET 52 are commonly connected to each other. Further, the sources of the MESFETs 81 through 83 and the MESFET 52 are commonly connected to each other. The gate of the MESFET 52 is electrically connected to a power terminal T1 through a resistor 84. The gate of the MESFET 81 is electrically connected to the gate of the MESFET 52 through a resistor 85. Similarly, the gate of the MESFET 82 is electrically connected to the gate of the MESFET 81 through a resistor 86. The gate of the MESFET 83 is electrically connected to the gate of the MESFET 82 through a resistor 87. The gate of the MESFET 83 is electrically connected to a control terminal T4. The resistors 84 through 87 are used as resistors for voltage division. Further, the resistors 84 through 87 are connected so as to voltage-divide a difference between a source potential $V_{dd}$ and a control voltage $V_{agc}$ and supply the result of voltage division to each of the gates of the MESFETs 81 through 83 and the MESFET 52.

The operation of the gain control circuit shown in FIG. 8 will now be described.

The gain control circuit shown in FIG. 8 amplifies a high-frequency signal $RF_{in}$ supplied from an input terminal T3 under the same operation as that performed in the fifth embodiment. The firstly amplified signal is attenuated by the total turned-on resistance of the turned-on resistances of the four MESFETs 52 and 81 through 83. Since the terminal T4 for control of the amount of attenuation is electrically connected to a source through the four resistors 84 through 87, the control voltage $V_{agc}$ applied to the terminal T4 is voltage-divided with the resistors 84 through 87 and the thus-divided voltages are respectively supplied to the gates of the MESFETs 81 through 83 and 52. When the control voltage $V_{agc}$ rises from 0 V to the positive side where the source voltage $V_{dd}$ is of a positive voltage and the MESFETs 81 through 83 and 52 are of depletion-types, a channel of the MESFET 52 starts to open or turn ON. A resistance of a MESFET 11 decreases. Next, a channel of the MESFET 81 starts to turn ON and channels of the MESFETs 82 and 83 are opened or turned ON in delayed timing. The timing for turning ON each of the channels of the MESFETs 52 and 81 through 83 is set by adjusting the resistors 84 through 87. When the control voltage $V_{agc}$ becomes equal to the source voltage $V_{dd}$, all the channels of the MESFETs 52 and 81 through 83 are turned ON so that the amount of attenuation is brought to the maximum.

Figure 9:
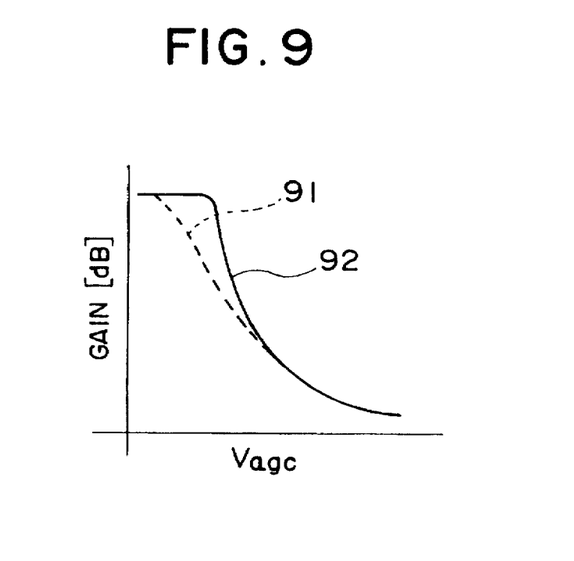
FIG. 9 is a graph plotting the gain control characteristic of the gain control circuit shown in FIG. 8.

FIG. 9 is a graph plotting the gain control characteristic of the gain control circuit shown in FIG. 8.

A change in gain 91 corresponding to the control voltage $V_{agc}$ supplied to the terminal T4 shown in FIG. 8 is illustrated in FIG. 9. According to a change in gain 92, which occurs in the gain control circuit described in the fifth embodiment, the attenuation abruptly starts at a given voltage as shown in FIG. 9. However, the gain change 91 developed in the present embodiment is smoother than the gain change 92. Further, a desired gain control characteristic is obtained by adjusting the resistance values of the resistors 84 through 87. The gain characteristic can be made smoother by increasing the number of stages of the MESFETs.

In the present embodiment as described above, the MESFETs 81 through 83 are added to the MESFET 52 and the voltages applied to the gates of the MESFETs 81 through 83 and the MESFET 52 are set so as to differ from one another. Thus, the gain control characteristic of the gain control circuit can be arbitrarily set.

Ninth Embodiment

Figure 10:
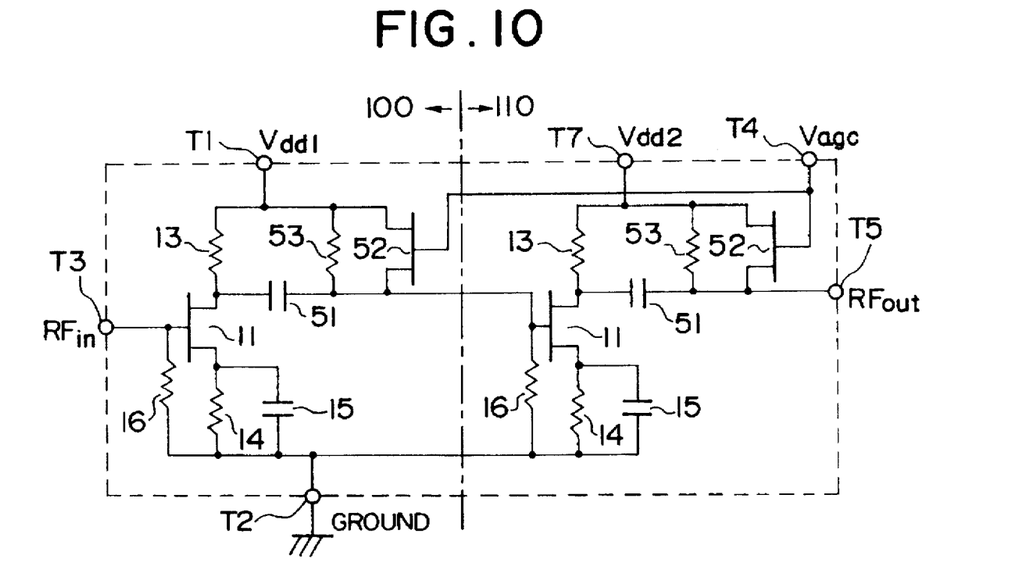
FIG. 10 is a circuit, diagram of an integrated circuit showing a ninth embodiment of the present invention.

FIG. 10 is a circuit diagram of an integrated circuit, showing a ninth embodiment of the present invention. Elements common to those shown in FIG. 5 are identified by common reference numerals.

The integrated circuit is a two-stage cascade-connection type gain control circuit wherein the gain control circuit of the fifth embodiment illustrated in FIG. 5 is employed in a first stage 100 and a second stage 110. These are integrated into and mounted on the same chip. However, a power terminal T7 of the second-stage gain control circuit 110 is provided separately from a power terminal T1 of the first-stage gain control circuit 100. The power terminals T1 and T7 source voltages $V_{dd1}$ and $V_{dd2}$ respectively.

The integrated circuit shown in FIG. 10, using the first-stage and second-stage gain control circuits 100 and 110, can provide a wide gain control range as compared with a single-stage gain control circuit.

Figure 11:
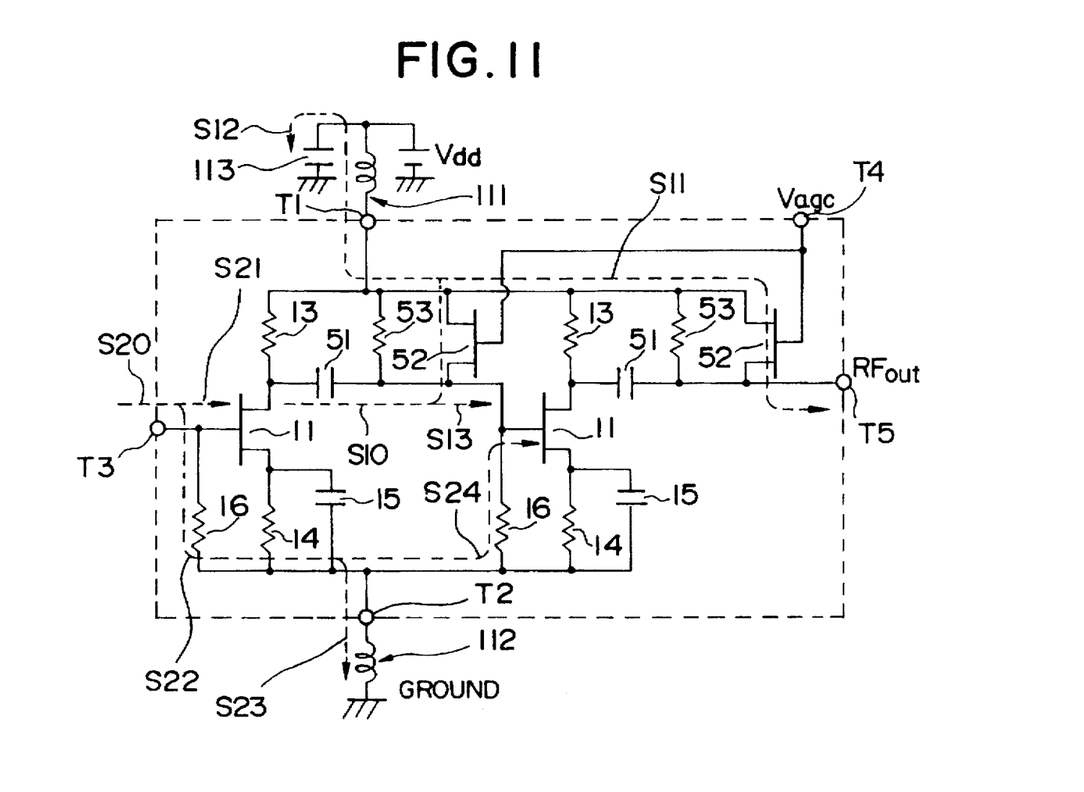
FIG. 11 is a diagram showing signal flow when the gain control circuit shown in FIG. 5 is two-stage connected.

FIG. 11 is a diagram showing a signal flow when the gain control circuit shown in FIG. 5 is arranged in two stages in a manner similar to the circuit of FIG. 10.

When the power terminal of the gain control circuits is commonly used, a signal S10 firstly amplified by a MESFET 11 is transmitted in an S13 direction when a channel of a MESFET 52 is pinched off. On the other hand, when the MESFET 52 is turned on, the signal S10 falls into a ground potential side through a decoupling capacitor 113 provided very close to the integrated circuit through the power terminal T1. Since, however, bonding wires or lead frames exist between the power terminal T1 and the decoupling capacitor 113 and respectively have inductances, the more the frequency of a signal $RF_{in}$ increases, the more the signal flowing in a S11 direction increases. Since the signal flowing in the S11 direction is provided to an output terminal T5 through the MESFET 52 of the gain control circuit 110 provided on the post-stage side, distortion occurs in the output signal, thus resulting in a reduction in the amount of attenuation. Since the power terminal T7 and the power terminal T1 are provided separately from each other in the integrated circuit shown in FIG. 10, this phenomenon can be prevented from occurring.

According to the present embodiment, as described above, since the power terminals T1 and T7 are respectively provided for the gain control circuits 100 and 110, the signal first amplified by the first-stage gain control circuit 100 is not returned to the output of the second-stage gain control circuit 110, thereby making it possible to obtain a larger amount of attenuation.

Tenth Embodiment

Figure 12:
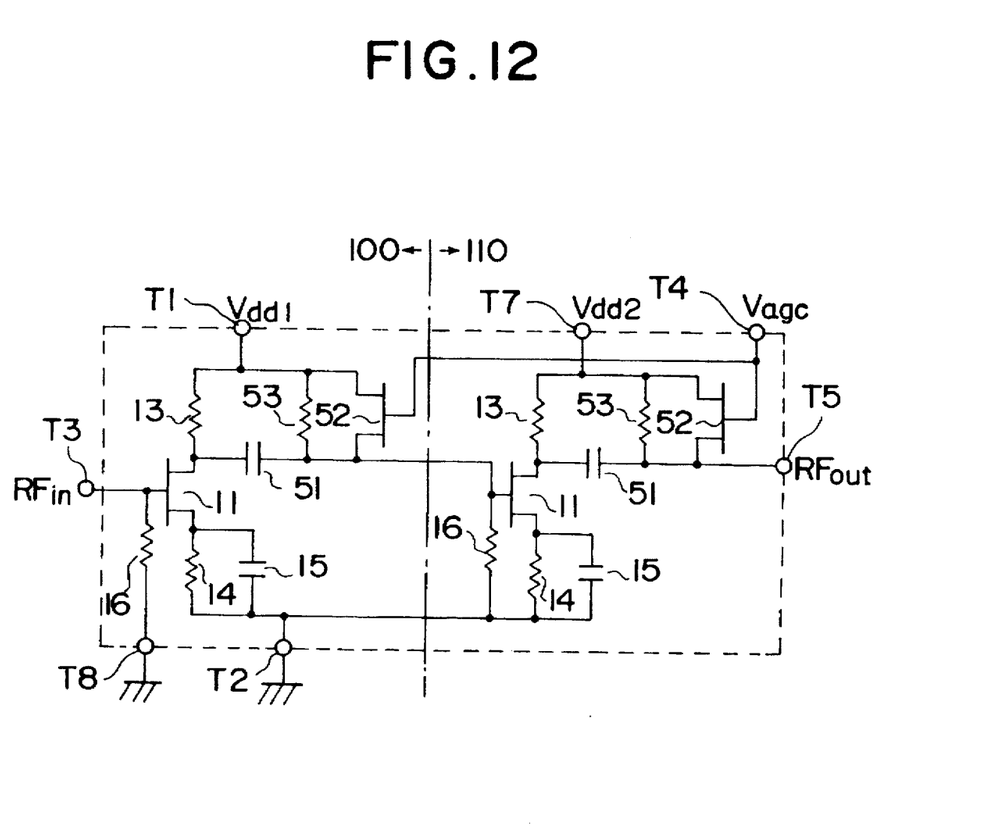
FIG. 12 is a circuit, diagram of an integrated circuit illustrating a tenth embodiment of the present invention.

FIG. 12 is a circuit diagram of an integrated circuit, showing a tenth embodiment of the present invention. Elements common to those shown in FIGS. 5 and 10 are identified by common reference numerals.

The integrated circuit is a two-stage cascade-connection type gain control circuit wherein the gain control circuit of the fifth embodiment illustrated in FIG. 5 is employed in a first stage 100 and a second stage 110. These are integrated into and mounted on the same chip. Similarly to the ninth embodiment, a power terminal T7 of the second-stage gain control circuit 110 is provided separately from a power terminal T1 of the first-stage gain control circuit 100. The power terminals T1 and T7 receive source voltages $V_{dd1}$ and $V_{dd2}$ respectively. Incidentally, a resistor 16 for bringing the gate of an MESFET 11 in the gain control circuit 100 corresponding to an input first stage to a ground potential is connected to a ground terminal T8 different from the other ground terminal T2 and is then grounded through the ground terminal T8.

The operation of the integrated circuit shown in FIG. 12 will now be described with reference to FIG. 11.

The integrated circuit shown in FIG. 12 using the gain control circuits 100 and 110 provided in two stages can expand a gain control range as compared with a single-stage gain control circuit. The resistor 16 of the gain control circuit 100 provides high-frequency input matching and holds a potential applied to the gate of a MESFET 11 at a ground potential Ground. As shown in FIG. 11, a signal S20 applied to an input terminal T3 is supplied to the gate of the MESFET 11 and is grounded through a resistor 16 and a terminal T2. Since, however, wire bonds or lead frames exist between the ground terminal T2 and the Ground and these have inductances, respectively, they interfere with the flow of a high-frequency signal and hence the high-frequency signal leaks to the following stage through a route S24. Therefore, a large amount of attenuation cannot be obtained. Since the ground terminal T8 is independently provided in the present embodiment, the input signal is prevented from leaking to the next stage.

According to the present embodiment as described above, since the resistor 16 in the gain control circuit 100, corresponding to the input first stage, is grounded through the terminal T2 for connecting other components to ground and the ground terminal T8 is provided independent of the terminal T2, the input signal is prevented from leaking directly to the next stage and stages subsequent to the next stage and hence a larger amount of attenuation can be obtained.

Eleventh Embodiment

Figure 13:
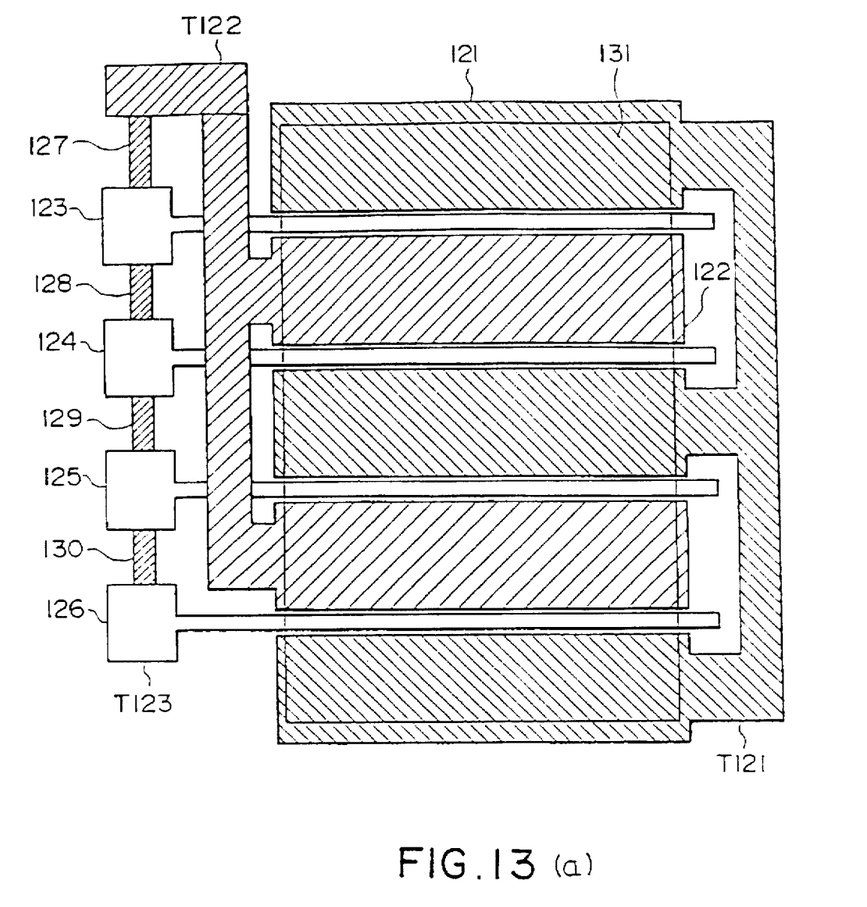
FIGS. 13(a)–13(b) a schematic view of an integrated circuit, showing an eleventh embodiment of the present invention.

FIG. 13 is a schematic view of an integrated circuit, showing an eleventh embodiment of the present invention.

The integrated circuit has a region in which a source electrode 121 and a drain electrode 122 for a MESFET are alternately disposed as shown in FIG. 13(a). Each of gate electrodes 123 through 126 for the MESFETs is formed between adjacent source and drain electrodes 121 and 122. The gate electrode 123 is electrically connected to the drain electrode 122 through a resistor 127. Further, the gate electrode 123 is electrically connected to the gate electrode 124 through a resistor 128. The gate electrode 124 is electrically connected to the gate electrode 125 through a resistor 129. Similarly, the gate electrode 125 is electrically connected to the gate electrode 126 through a resistor 130. A region designated by numeral 131 in FIG. 13 is an active region. Further, a region in which each of the gate electrodes 123 through 126 is disposed between adjacent drain and source electrodes 122 and 121, is operated as a MESFET. The gate electrodes 123 through 126 extend from the active region and are respectively electrically connected to the resistors 127 through 130, each composed of an injection resistor or a thin film resistor.

FIG. 13(b) is a circuit diagram of FIG. 13(a). T121, T122 and T123 shown in FIG. 13(a) respectively correspond to terminals shown in FIG. 13(b). If the integrated circuit showing the present embodiment is applied to the gain control circuit shown in FIG. 8, then the components configured as shown in FIG. 13 correspond to the MESFETs 52 and 81 through 83 and the resistors 84 through 87, respectively. Thus, when four MESFETs are formed, for example, it is understood that the number of regions used as drain electrodes for the MESFETs and the number of regions used as source electrodes for the MESFETs may be three, respectively.

According to the present embodiment as described above, since the drain and source electrodes for each MESFET are alternately disposed and the electrodes 123 through 125 corresponding to the gate electrodes for the MESFETs are electrically connected to each other through the resistors, the gain control circuit showing the eighth embodiment can be efficiently formed in a reduced area.

Twelfth Embodiment

Figure 14:
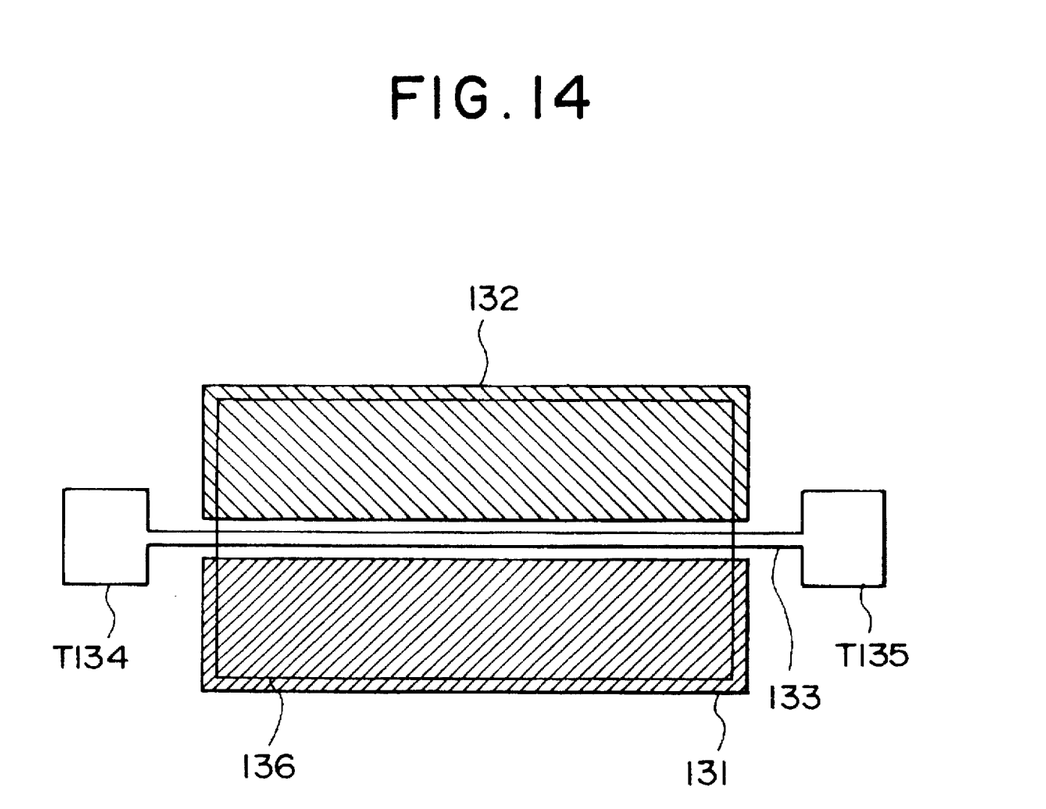
FIG. 14 a schematic view of an integrated circuit, illustrating a twelfth embodiment of the present invention.

FIG. 14 is a schematic view of an integrated circuit showing a twelfth embodiment of the present invention.

The integrated circuit 131, a MESFET composed of a drain electrode 131, a source electrode 132 and a gate electrode 133. A region designated as numeral 136 in FIG. 14 serves as an active region. The gate electrode 131 is made up of a material such as W-Al (tungsten.aluminum), which has a large whose resistance value. Further, the thickness of the gate electrode 131 is set as thin as possible and the gate length thereof is formed shorter. Pads T134 and T135 for connecting the integrated circuit to an external circuit are provided at either end of the gate electrode 133.

The gate electrode 133 of the MESFET employed in the present embodiment has a resistance. Thus, when the MESFET is applied to the eleventh embodiment, the resistors 127 through 130 can be omitted. Namely, the resistance of the gate electrode 133 for the MESFET can be used as an alternative to the resistors 127 through 130. Therefore, the resistance of each MESFET doubles as a resistor for voltage division. The area for laying out the gain control circuit showing the eighth embodiment can be further reduced. Now, the drain electrode 131 and the source electrode 132 may be respectively divided into a plurality of parts so that a plurality of MESFETs are formed.

The present invention is not necessarily limited to the above embodiments. Various modifications can be made to the invention. Examples of such modifications are as follows:

(a) Although all the MESFETs 11 ... MESFET 83 employed in the first through twelfth embodiments are GaAs depletion-type MESFETs, each of them may be a transistor using a semiconductor such as silicon or phosphorus-indium. Even if the MESFETs are used as J-FETs, MOSFETs or transistors each having an HEMT structure, they can exhibit advantageous effects similar to those obtained in the aforementioned embodiments.

(b) Although single gate type MESFETs are used as the MESFETs 11 through 72 employed in the first through seventh embodiments, dual-type MESFETs may be used as an alternative to those.

(c) Although the source potential $V_{dd}$ is set positive in the first through twelfth embodiments, a negative potential may be applied as the source potential $V_{dd}$. When the minus source potential is applied, the gain control voltages $V_{agc}$ and $V_{agc2}$ may be set negative.

(d) As shown in FIGS. 1 through 14, all the circuit elements are integrated and formed on the same substrate. However, elements having other functions and a plurality of circuits can be formed on the substrate. It is needless to say that the respective MESFETs, the capacitors and the resistors or the like can be composed of part circuits individually.

(e) Although the number of the cascade-connected stages of the gain control circuits is two in the ninth and tenth embodiments, the number of stages is not necessarily limited to two, and three stages or more may be connected.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A gain control circuit, comprising:
   an amplifier circuit having an input terminal for receiving an input signal, a first resistor, a first terminal connected to the first resistor for receiving a first potential through the first resistor, a second resistor, a second terminal connected to the second resistor for receiving a second potential through the second resistor, and an output terminal connected to the first terminal for generating an amplified signal, said amplifier circuit varying a conducting state between the first and second terminals based on the input signal; and
   a control circuit connected between the first and second terminals, for receiving a control signal at a control terminal, said control circuit varying a conducting state between the first and second terminals based on the control signal.

2. The gain control circuit according to claim 1, wherein said amplifier circuit includes a first transistor having a control electrode for receiving the input signal, a first electrode connected to the first terminal, and a second electrode connected to the second terminal, and wherein said control circuit includes a second transistor having a control electrode for receiving the control signal, a first electrode connected to the first electrode of said first transistor, and a second electrode connected to the second electrode of said first transistor.

3. The gain control circuit according to claim 2, further including third and fourth resistors, wherein the output terminal is connected to the first electrode of the first transistor through the third resistor, and the first electrode of the second transistor is connected to the output terminal through the fourth resistor.

4. The gain control circuit according to claim 2, further including a third transistor connected between the first terminal and the first electrode of the first transistor and having a control electrode connected to the first electrode of the first transistor.

5. A gain control circuit, comprising:
   an amplifier circuit having
     an input terminal for receiving an input signal,
     a first resistor,
     a first terminal connected to the first resistor for receiving a first potential through the first resistor,
     a second terminal for connection to a second potential,
     an output terminal connected to the first terminal for generating an amplified signal, and
     a first transistor having a control electrode for receiving the input signal, a first electrode for connection to the first potential through the first resistor, and a second electrode for connection to the second potential,
   a control circuit, for connection between the first potential and the first terminal of said amplifier circuit, having
     a control terminal for receiving a control signal, and
     a second transistor having a control electrode for receiving the control signal, a first electrode coupled to a first end of the first resistor, and a second electrode coupled to a second end of the first resistor, and
     a capacitor connected between the first electrode of the first transistor and the second electrode of the second transistor,
   said amplifier circuit varying a conducting state between the first and second terminals based on the input signal; and
   said control circuit varying a conducting state between the first terminal of said amplifier circuit and the first potential, based on the control signal.

6. The gain control circuit according to claim 5, further including a second resistor connected between the first and second electrodes of the second transistor.

7. The gain control circuit according to claim 6, further including a third resistor connected between the first terminal of the second transistor and a first end of the second resistor, and a fourth resistor connected between the second terminal of the second transistor and the capacitor.

8. The gain control circuit according to claim 5, wherein the control signal is a first control signal, and further including a third transistor having
   a control electrode for receiving a second control signal,
   a fifth resistor,
   a sixth resistor,
   a first electrode connected to the first electrode of the first transistor through the fifth resistor, and
   a second electrode connected to the second electrode of the second transistor through the sixth resistor.

9. The gain control circuit according to claim 5, wherein said control circuit further comprises a plurality of parallel-connected transistors, each having a control electrode for receiving the control signal and further having first and second electrodes respectively connected to first and second ends of the first resistor.

10. The gain control circuit according to claim 5, wherein said control circuit further comprises:
    a plurality of control transistors, each comprising:
      a first electrode coupled to a first end of the first resistor;
      a second electrode coupled to a second end of the first resistor;
      a control electrode; and
      resistive means; and
    wherein each of said control electrodes of said control transistors respectively receives the control signal through the resistive means such that a resistance value between each said control electrode and the control terminal is different.

11. The gain control circuit according to claim 10, wherein said resistive means includes a plurality of series connected resistors, and each said control electrode of said control transistors receives the control signal through a different number of the resistors.

12. An integrated circuit comprising:
    a plurality of gain control circuits, each including:
      an amplifier circuit having an input terminal for receiving an input signal, a resistive means, a first terminal connected to the resistive means for receiving a first potential through the resistive means, a second terminal for connection to a second potential, and an output terminal connected to the first terminal, said amplifier circuit varying a conducting state between the first and second terminals based on the input signal; and
      a control circuit connected in parallel with the resistive means and having a control electrode for receiving a control signal, said control circuit varying a conducting state between the first and second terminals based on the control signal; and
    wherein one of said gain control circuits receives a respective output signal from the output terminal of another of said gain control circuits, and each said gain control circuit receives the first potential through the corresponding first terminal, independently of any other of said gain control circuits.

13. An integrated circuit comprising:

a plurality of gain control circuits, each including:

an amplifier circuit having an input terminal for receiving an input signal, a resistive means, a first terminal connected to the resistive means for receiving a first potential via the resistive means, a second terminal for connection to a second potential and an output terminal connected to the first terminal, said amplifier circuit varying a conducting state between the first and second terminals based on the input signal; and a control circuit connected in parallel with the resistive means and having a control electrode for receiving a control signal, said control circuit varying a conducting state between the first and second terminals based on the control signal; and wherein one of said gain control circuits receives a respective output signal from the output terminal of another of said gain control circuits, and each said gain control circuit receives the second potential through the corresponding second terminal, independently of any other of said gain control circuits.

* * * * *